United States Patent
Yasukawa

(10) Patent No.: US 10,050,232 B2
(45) Date of Patent: Aug. 14, 2018

(54) LIGHT EMITTING DEVICE AND ORGANIC ELECTROLUMINESCENCE DISPLAY DEVICE

(71) Applicant: Japan Display Inc., Tokyo (JP)

(72) Inventor: Koji Yasukawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/712,317

(22) Filed: Sep. 22, 2017

(65) Prior Publication Data
US 2018/0090715 A1    Mar. 29, 2018

(30) Foreign Application Priority Data

Sep. 29, 2016 (JP) ................. 2016-191586

(51) Int. Cl.
| | | |
|---|---|---|
| *H01L 51/50* | (2006.01) | |
| *H01L 51/52* | (2006.01) | |
| *C09K 11/06* | (2006.01) | |
| *H01L 27/32* | (2006.01) | |

(52) U.S. Cl.
CPC .......... *H01L 51/5265* (2013.01); *C09K 11/06* (2013.01); *H01L 27/322* (2013.01); *H01L 51/5012* (2013.01); *H01L 51/5246* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 2251/558* (2013.01)

(58) Field of Classification Search
CPC ............ H01L 51/5012; H01L 51/5056; H01L 51/5072; H01L 51/5084; H01L 51/5092; H01L 51/5096; C09K 11/06
See application file for complete search history.

(56) References Cited

U.S. PATENT DOCUMENTS

2017/0243929 A1* 8/2017 Choi ................... H01L 51/5044

FOREIGN PATENT DOCUMENTS

JP    2005-116516 A    4/2005

* cited by examiner

*Primary Examiner* — Hoai V Pham
(74) *Attorney, Agent, or Firm* — Typha IP LLC

(57) ABSTRACT

A light emitting device includes a pixel electrode, an organic layer, and a counter electrode, wherein the organic layer includes a first organic layer having a hole injecting property, a second organic layer having a hole transporting property, a third organic layer having an electron blocking property, a light emitting layer containing a host material and a dopant material, a fourth organic layer having a hole blocking property, and a fifth organic layer having an electron transporting property, wherein the fifth organic layer includes an alkali metal such as calcium or lithium and the like or an alkaline earth metal, and a total layer thickness of the first organic layer, the second organic layer, and the third organic layer is smaller than a total layer thickness of the fourth organic layer and the fifth organic layer.

20 Claims, 6 Drawing Sheets

LIGHT EMITTING DEVICE AND ORGANIC ELECTROLUMINESCENCE DISPLAY DEVICE

CROSS-REFERENCE TO RELATED APPLICATIONS

This application is based upon and claims the benefit of priority from the prior Japanese Patent Application No. 2016-191586, filed on Sep. 29, 2016, the entire contents of which are incorporated herein by reference.

FIELD

The present invention relates to an organic electroluminescence display device. An embodiment of the present invention relates to a light emitting device of an organic electroluminescence display device.

BACKGROUND

An organic electroluminescence (organic EL) display device is arranged with a light emitting device in each pixel. An organic EL display device displays an image by individually controlling emitted light from the light emitting device. The light emitting device has a structure in which a layer including an organic EL material (organic EL layer) is sandwiched between a pair of electrodes. When a potential is applied to the electrode of the light emitting device, electrons are injected from the cathode and holes are injected from the anode. The electrons and the holes move in the organic layer, recombine with the host molecule of the light emitting layer and release energy. As a result, the luminescent molecules in the light emitting layer are excited by the energy released thereby, and then the luminescent molecules return to the ground state to emit light. The light emission intensity of the light emitting device can be controlled by the applied voltage or the amount of current flowing in the device. Here, in order to obtain higher luminance, a larger voltage may be applied to increase the current density flowing in the light emitting device. However, the increase in current density flowing in the light emitting device results in shortening the lifetime of the light emitting device. Thus, various measures have been taken to obtain high light extraction efficiency.

For example, Japanese Unexamined Patent Application Publication No. 2005-116516 discloses a method of resonating light between a total reflection surface on the anode side and a semi-reflecting surface on the cathode in a top emission type light emitting device to amplify a necessary emission spectrum.

The semi-reflecting surface transmits part of the light emitted by the organic layer, and reflects the other part. The reflected light is transmitted through the organic layer and the anode, and is reflected on the total reflection surface. Subsequently, the reflected light is transmitted through the anode and the organic layer, and part of the light passes through the semi-transparent cathode, and the other part is reflected on the semi-transparent cathode. On the other hand, the total reflection surface reflects the light emitted from the organic layer. The reflected light is transmitted through the anode, the organic layer, and the semi-transparent cathode or is reflected on the semi-transparent cathode. The light generated in the light emitting layer can be converged in the extraction direction, by utilizing the resonance effect of light caused by repeated reflection between the semi-reflecting surface and the total reflection surface.

When the optical resonance structure is applied to the light emitting device, the light emitting position of the organic EL layer between the semi-reflecting surface and the total reflecting surface greatly influences the light extraction efficiency. However, due to restrictions on the film thickness of the organic EL layer, it was almost impossible to freely select the light emitting position.

SUMMARY

An embodiment of the present invention is a light emitting device including a pixel electrode arranged on a substrate and having a reflective surface disposed on the substrate side, an organic layer disposed on the opposite side to the substrate with the pixel electrode interposed therebetween, and a counter electrode having a semi-transparent property disposed on the opposite side to the pixel electrode with the organic layer interposed therebetween, wherein the organic layer includes a first organic layer having a hole injecting property arranged on the pixel electrode, a second organic layer having a hole transporting property arranged on the first organic layer, a third organic layer having an electron blocking property arranged on the second organic layer, a light emitting layer containing a host material and a dopant material arranged on the third organic layer, a fourth organic layer having a hole blocking property arranged on the light emitting layer, and a fifth organic layer having an electron transporting property arranged on the fourth organic layer, wherein the fifth organic layer includes an alkali metal or an alkaline earth metal such as calcium or lithium and the like, and a total layer thickness of the first organic layer, the second organic layer, and the third organic layer is smaller than a total layer thickness of the fourth organic layer and the fifth organic layer.

BRIEF DESCRIPTION OF DRAWINGS

FIG. 5A, FIG. 5B and FIG. 50 are enlarged sectional views showing the configuration of the organic electroluminescent display device according to one embodiment of the present invention.

DESCRIPTION OF EMBODIMENTS

Figure 1A:
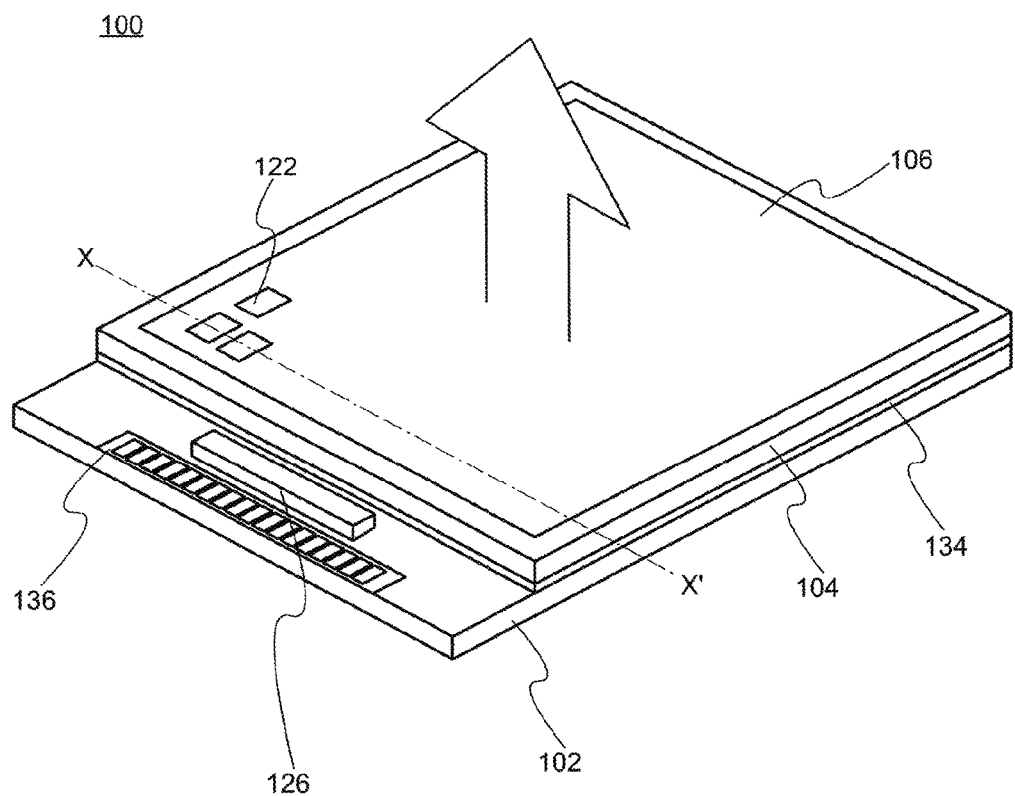
FIG. 1A is a perspective view showing the configuration of the organic electroluminescent display device according to one embodiment of the present invention.

An embodiment of the present invention will hereinafter be described with reference to the drawings. However, the present invention can be practiced in many different modes, and is not to be interpreted as being limited to contents of description of the embodiment illustrated below. While the width, the thickness, the shape and the like of each section may be more schematically represented than those in an actual mode to make the description clearer in the drawings, this is only one example, and is not intended to limit the interpretation of the present invention. Detailed description may be omitted, as needed, by assigning elements similar to those described above with reference to the already described drawings the same reference signs in the present specification and the drawings.

In the present specification, when a member or region exists "on (or under)" another member or region, this includes not only a case where the member or region exists just above (or just below) the other member or region but also a case where the member or region exists above (or below) the other member or region, i.e., a case where another component is included between the member or region above (below) the other member or region and the other member or region except as otherwise limited.

When applying the optical resonance structure to the light emitting device in the top emission type light emitting device, light emitted from the organic layer is extracted to the cathode side by optical interference with the cathode side as the semi-reflecting surface and the anode side as the total reflective surface. Therefore, the light emission position of the organic layer between both electrodes greatly influences the light extraction efficiency. In order to efficiently extract the fight emitted from the organic layer by the optical interference, it is necessary to make the optical path length from the light emitting layer to the semi-reflecting surface on the cathode side longer than the optical path length from the light emitting layer to the total reflective surface on the anode side. The optical path length from the light emitting layer to the total reflective surface on the anode side mainly depends on the layer thickness of the hole transporting layer. The optical path length from the light emitting layer to the semi-reflecting surface on the cathode side mainly depends on the layer thickness of the electron transporting layer. That is, in the top emission type light emitting device, it is necessary to make the layer thickness of the electron transporting layer longer than the layer thickness of the hole transporting layer. Here, the "light extraction efficiency" indicates the current efficiency representing the luminance with respect to the unit current.

However, the electron mobility in the electron transporting layer is smaller than the hole mobility in the hole transporting layer. Therefore, when the layer thickness of the electron transporting layer is made larger than the layer thickness of the hole transporting layer, there arises a problem that the drive voltage of the light emitting device is increased. Therefore, also in the top emission type light emitting device, it is necessary to design the layer thickness of the electron transporting layer to about 10 nm to 50 nm. That is, there is a problem that the light emitting position is arranged closer to the cathode side than the anode side, and light emitted from the organic layer can not be extracted efficiently.

<Structure of Organic EL Display Device>

Figure 1B:
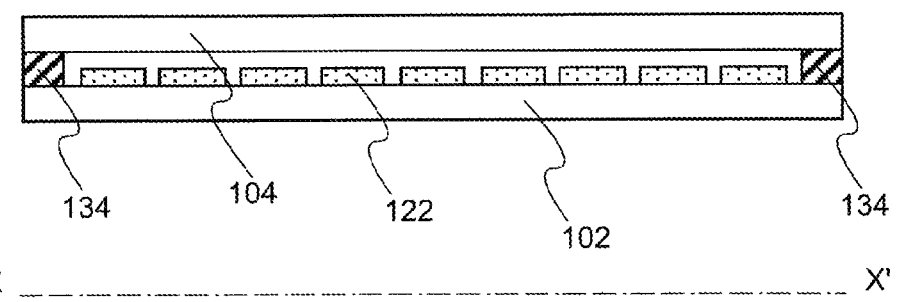
FIG. 1B and FIG. 1C are cross-sectional views showing the configuration of the organic electroluminescent display device according to one embodiment of the present invention.
Figure 1C:
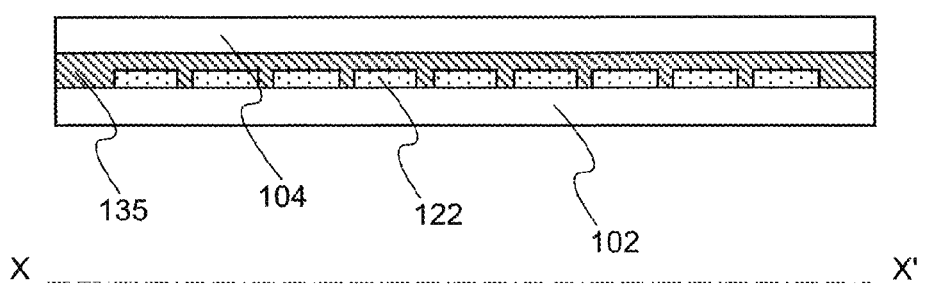
Figure 2:
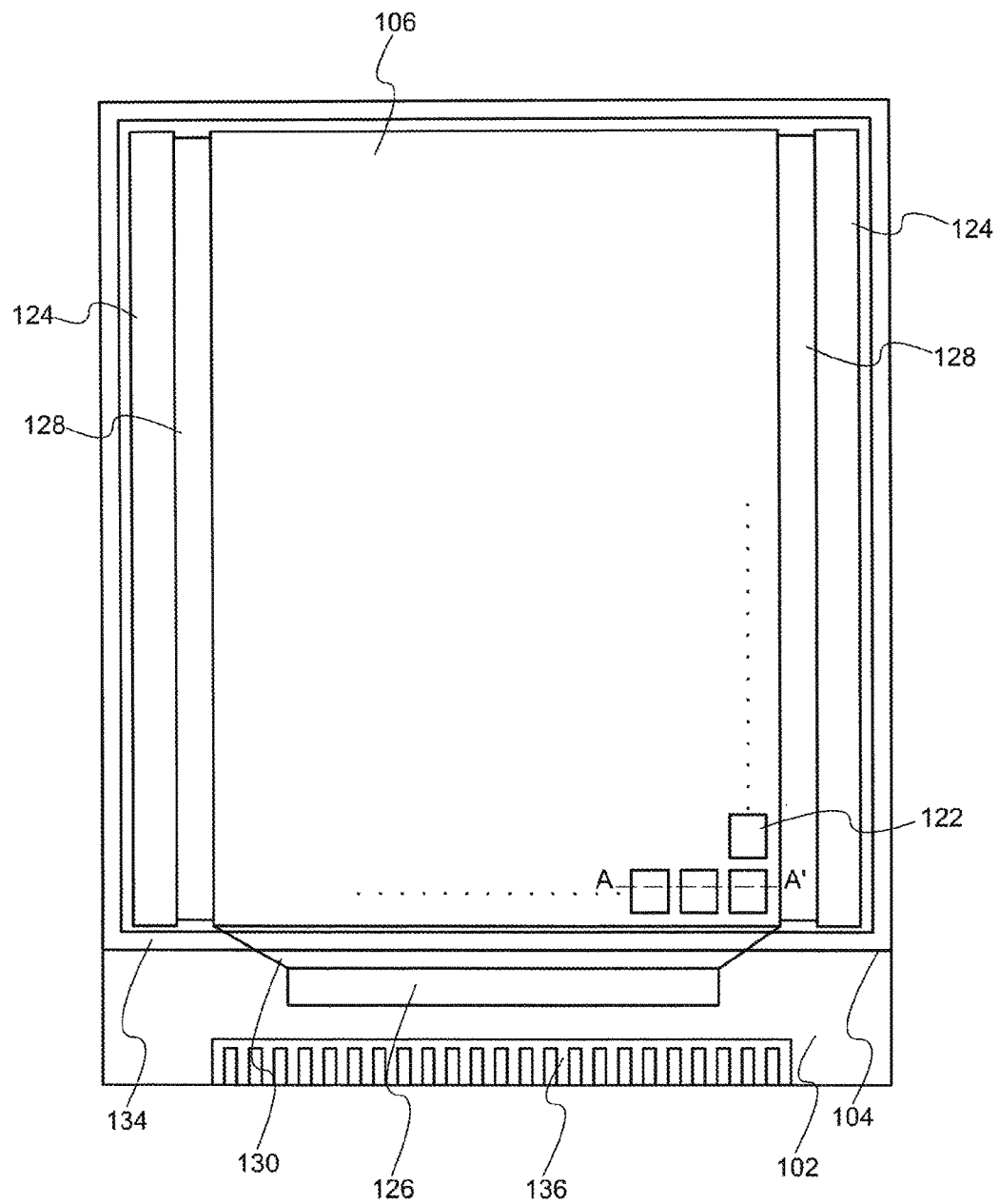
FIG. 2 is a plan view showing the configuration of the organic electroluminescent display device according to one embodiment of the present invention.

FIG. 1A is a perspective view showing the configuration of the organic EL display device according to the present embodiment. FIG. 1B and FIG. 1C are cross-sectional views showing the configuration of the organic EL display device according to the present embodiment. FIG. 2 is a plan view showing the configuration of the organic EL display device according to the present embodiment. The schematic configuration of the organic EL display device 100 according to the present embodiment will be described with reference to FIG. 1A, 1B, 1C, and FIG. 2.

As shown in FIG. 1A, an organic EL display device 100 is provided with a pixel region 106 on a first substrate 102.

A plurality of pixels 122 are arranged in a matrix form in the pixel region 106. On the upper surface of the pixel region 106, a second substrate 104 as a sealing material is provided. As shown in FIG. 1B, the second substrate 104 is fixed on the first substrate 102 by a sealing material 134 surrounding the pixel region 106. The pixel region 106 on the first substrate 102 is sealed by the second substrate 104 and the sealing material 134 so as not to be exposed to the atmosphere. The sealing method of the pixel region 106 is not particularly limited thereto, and a passivation film may be directly formed so as to cover the pixel region 106 provided on the first substrate 102 without providing the second substrate 104. In fixing the first substrate 102 and the second substrate 104, for example, as shown in FIG. 1C, instead of the sealing material 134 surrounding the pixel region 106, a filling material 135 filling the gap between the first substrate 102 and the second substrate 104 may be used to entirely cover the pixel region 106.

A terminal section 136 is provided at one end of the first substrate 102. The terminal section 136 is disposed outside of the second substrate 104. The connection terminal of the terminal region 136 forms a contact point between a device outputting a video signal or a power supply and the wiring board that connects the organic EL display device 100. The first substrate 102 is provided with a first driving circuit 124 and a second driving circuit 126 which outputs the video signal input from the terminal region 136 to the pixel region 106.

Each transistor described below within the pixel region 106 and the first driving circuit 124 are connected to each other by a wiring (not shown). Each of the transistors described below within the pixel region 106 and the second driving circuit 126 are connected to each other by a wiring (not shown). The pixel region 106 is provided with scanning signal lines and video signal lines in addition to the pixels 122. Each of the pixels 122 in the pixel region 106 is respectively connected to the first driving circuit 124 and the second driving circuit 126 via the wirings. For example, the first driving circuit 124 is a driving circuit which outputs a scanning signal to the pixel region 106 via the scanning signal line. The second driving circuit 126 is a driving circuit which outputs a video signal to the pixel region 106 via the video signal line. FIG. 2 shows a mode including the first wiring extension region 128 between the pixel region 106 and the first driving circuit 124 and the second wiring extension region 130 between the pixel region 106 and the second driving circuit 126.

Figure 3:
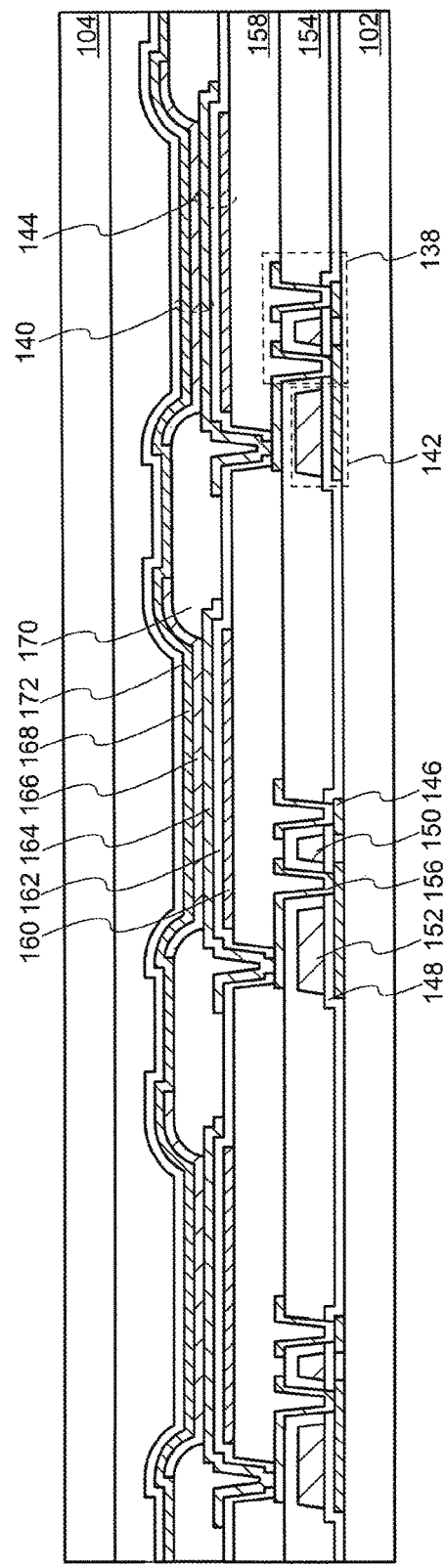
FIG. 3 is a cross-sectional view showing the configuration of the organic electroluminescent display device according to one embodiment of the present invention.

FIG. 3 is a cross-sectional view showing the configuration of the organic EL display device according to the present embodiment. The configuration of the pixel region 106 according to the present embodiment will be described with reference to FIG. 3.

In the pixel region 106, the plurality of pixels 122 are arranged in a matrix form. FIG. 3 is a schematic cross-sectional view of the pixel region 106 along the line A-A° shown in FIG. 2. The pixel 122 has a circuit element layer. In this embodiment, the circuit element layer includes a semiconductor layer 146, a gate insulating layer 148, a gate electrode 150, a first capacitor electrode 152, a first insulating layer 154, a source/drain electrode 156, a second insulating layer 158, a second capacitor electrode 160, a third insulating layer 162, a pixel electrode 164, an organic layer 166, an opposite electrode 168, and a bank layer 170.

Each of the plurality of pixels 122 in the pixel region 106 includes a transistor 138, a light emitting device 140, a first capacitor element 142, and a second capacitor element 144. The light emitting device 140 is connected to the transistor 138. The transistor 138 controls light emission of the light emitting device 140. The first capacitor element 142 holds the gate potential of the transistor 138 and the second capacitor element 144 is provided to adjust the amount of current flowing through the light emitting device 140.

As shown in FIG. 3, each of the plurality of pixels 122 has a transistor 138 for each pixel, and the transistor 138 is arranged in a matrix form in the pixel region 106. The transistor 138 has a structure in which a semiconductor layer 146, a gate insulating layer 148, and a gate electrode 150 are stacked. The semiconductor layer 146 is formed of amorphous or polycrystalline silicon or an oxide semiconductor, or the like. The source/drain electrode 156 is provided above the gate electrode 150 with the first insulating layer 154 interposed therebetween. The second insulating layer 158 is provided above the source/drain electrode 156 as a planarization layer. A light emitting device 140 is provided on the upper surface of the second insulating layer 158. The second insulating layer 158 has a substantially flat surface by embedding a contact hole provided in the source-drain electrode 156 and the first insulating layer 154 and burying unevenness of the first insulating layer 154 caused by respective shapes of the gate electrode 150 and the semiconductor layer 146. The second insulating layer 158 may have a flat surface formed by performing etching processing or chemical mechanical polishing processing of a surface of an inorganic insulating layer. The second insulating layer 158 may have a flat surface leveled after applying or depositing a composition including a precursor such as acrylic, polyimide or the like.

The first capacitor element 142 is formed in a region where the semiconductor layer 146 and the first capacitor electrode 152 overlap each other with the gate insulating layer 148 used as a dielectric layer and a region where the source-drain electrode 156 and the first capacitor electrode 152 overlap each other with the first insulating layer 154 used as a dielectric layer.

Each of the plurality of pixels 122 has a light emitting device 140 for each pixel. The light emitting devices 140 are arranged in a matrix form in the pixel region 106. The light emitting device 140 has a structure in which a pixel electrode 164, an organic layer 166, and an opposite electrode 168 which are electrically connected to the transistor 138 are stacked. The organic layer 166 may emit light of each color of red (R), green (G), and blue (B), or may emit white light.

The pixel electrode 164 is provided for each pixel on the upper surface of the second insulating layer 158. The pixel electrode 164 is provided over the source/drain electrode 156 with the second insulating layer 158 interposed therebetween. A bank layer 170 is provided to cover a peripheral edge of the pixel electrode 164 and expose an inner region of the pixel electrode 164. In other words, a bank layer 170 which covers the end portion and has an opening portion exposing the upper surface of the pixel electrode 164 is provided on the upper surface of the pixel electrode 164. Furthermore, the bank layer 170 embeds contact holes provided in the pixel electrode 164 and the second insulating layer 158. By disposing the bank layer 170 formed of an insulating material, the opposite electrode 168 and the pixel electrode 164 can be prevented from short-circuiting at the end portion of the pixel electrode 164. Furthermore, adjacent pixels 122 can be reliably insulated. On the upper surface of the bank layer 170, an organic layer 166 is provided so as to cover the opening portion. The organic layer 166 is provided for each pixel on the upper surface of the pixel electrode 164 and the bank layer 170. The opposite electrode 168 is provided so as to cover the upper surface of the bank layer 170 from the upper surface of the organic layer 166. The opposite electrode 168 is provided as a common electrode across the plurality of pixels 122.

The bank layer 170 is formed of a photosensitive organic resin material. A photosensitive acrylic resin, a photosensitive polyimide resin, or the like is used as the photosensitive organic resin material.

A sealing layer 172 is provided on the light emitting device 140. The sealing layer 172 is provided to cover the entire surface of the light emitting device 140 and prevent entrance of water or the like. The sealing layer 172 preferably has a translucent property by a film such as a silicon nitride film, an aluminum oxide film or the like. On the top of the sealing layer 172, a filling material may be provided between the sealing layer 172 and the second substrate 104. In addition, the sealing layer 172 may partially include an organic layer. For example, a stacked structure such as an inorganic layer an organic layer an inorganic layer may be used.

When white light is emitted from the light emitting device 140, a light shielding layer and a color filter layer may be provided on the second substrate 104. The color filter layer is disposed at a position facing each of the plurality of pixels 122. The light shielding layer is disposed at a position that partitions each of the plurality of pixels 122. When white light is emitted from the light emitting device 140, the organic EL display device 100 can perform color display by being provided with the color filter layer. Further, an optical film such as a polarizing plate and a phase plate may be provided on the second substrate 104. The optical film covers the plurality of pixels 122 and is disposed on the outer surface of the second substrate 104. The optical film is arranged to suppress deterioration of visibility due to external light incident on the organic EL display device 100 being reflected by the pixel electrode 164b.

Figure 4:
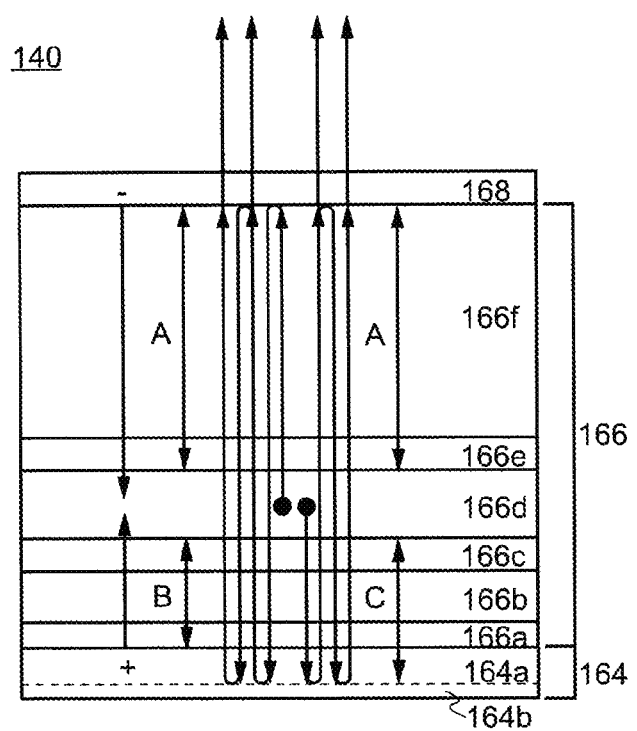
FIG. 4 is an enlarged sectional view showing the configuration of the organic electroluminescent display device according to one embodiment of the present invention.

The configuration of the light emitting device 140 according to the present embodiment will be described in more detail with reference to FIG. 4. FIG. 4 is a cross-sectional view showing the configuration of the organic EL display device according to the present embodiment. FIG. 4 is a cross-sectional view of the light emitting device 140 shown in FIG. 3.

The light emitting device 140 has a structure in which a pixel electrode 164, an organic layer 166, and an opposite electrode 168, which are electrically connected to the transistor 138, are stacked. The light emitting device 140 is a two-terminal element. The light emitting device 140 controls the value of the current flowing between the pixel electrode 164 and the opposite electrode 168 so that the light emission of the organic layer 166 including the light emitting layer 166d sandwiched between the pixel electrode 164 and the opposite electrode 168 is controlled. In the present embodiment, the light emitting device 140 shows a top-emission structure in which light emitted from the light emitting layer 166d is radiated to the opposite electrode 168 side.

It is preferable to use ITO (Indium Tin Oxide) or IZO (Indium Zinc Oxide) which have excellent hole injecting properties as the pixel electrode 164a. ITO and IZO are a kind of transparent conductive material. Although the transmittance in the visible light band of ITO and IZO is high, the reflectance is extremely low. Therefore, in order to add the function of reflecting light to the pixel electrode 164b, a metal layer such as aluminum (Al), sliver (Ag) or the like is preferably stacked on the translucent conductive material formed of ITO or IZO or the like to form a total reflection surface. Alternatively, as shown in FIG. 3, the third insulating layer 162 and the second capacitor electrode 160 may be provided under the pixel electrode 164 formed of ITO, IZO, or the like to form the second capacitor element 144. In this case, the second capacitor electrode 160 may be formed of a metallic material so as to combine the function of the total reflection surface. The pixel electrode 164 may be a conductive film having an excellent hole injecting property and a total reflection surface. The total reflection surface of the pixel electrode 164 is disposed on the opposite side to the organic layer 166. In the case of the stacked structure as described above, the total thickness of the pixel electrode 164 is preferably in the range of 50 nm to 300 nm. In particular, the thickness of the transparent conductive material formed of ITO, IZO or the like which is the outermost surface of the pixel electrode 164 (pixel electrode 164a) is preferably in the range of 1 nm to 20 nm.

The opposite electrode 168 may have an excellent electron injecting property. It is preferably formed of a semi-transparent conductive film having semi-permeability such as a magnesium-silver alloy (Mg—Ag alloy) or a stacked film of a magnesium-silver alloy and silver. Here, the semi-permeability of the semi-transparent conductive film indicates that the transmittance is in the range of 20% to 90%. The light which did not pass through the semi-transparent conductive film is reflected. Here, the surface of the opposite electrode 168 on the side of the organic layer 166 is defined as a semi-reflecting surface. The thickness of the opposite electrode 168 is not particularly limited as long as it satisfies the transmittance mentioned above. For example, in the case of using Mg—Ag alloy, it is preferably in the range of 5 nm to 30 nm.

The organic layer 166 is formed using a low molecular weight or high molecular weight organic material. In the case of using a low molecular weight organic material, in addition to the light emitting layer 166d including a light emitting organic material, the organic layer 166 includes a hole injection layer 166a, a hole transporting layer 166b, an electron blocking layer 166c, a hole blocking layer 166e, and an electron transporting layer 166f and the like. In the present embodiment, the organic layer 166 is stacked in the order of the electron blocking layer 66c, the hole transporting layer 166b, and the hole injection layer 166a from the light emitting layer 166d toward the pixel electrode 164. In the present embodiment, in the organic layer 166, a hole blocking layer 166e and an electron transporting layer 166f are stacked in this order from the light emitting layer 166d toward the opposite electrode 168. Although not shown in the drawing, an electron injection layer may be added between the opposite electrode 168 and the electron transporting layer 166f in the organic layer 166.

Note that in the present embodiment, a known material can be used as a main material constituting the hole injection layer 166a, the hole transporting layer 166b, the electron block layer 166c, the light emitting layer 166d, the hole block layer 166e, and the electron transporting layer 166f.

Examples of the hole transporting material used for the hole injection layer 166a and the hole transporting layer 166b include heterocyclic conjugated monomers, oligomers, polymers and the like such as benzidine or a derivative thereof, styrylamine or a derivative thereof, triphenylmethane or a derivative thereof, porphyrin or a derivative thereof, triazole or a derivative thereof, imidazole or a derivative thereof, an oxadiazole or a derivative thereof, a polyarylalkane or a derivative thereof, a phenylenediarnine or a derivative thereof, an arylamine or a derivative thereof, an oxazole or a derivative thereof, an anthracene or a derivative thereof, a fluorenone or a derivative thereof, a hydrazone or a derivative thereof, a stilbene or a derivative thereof, phthalocyanine or a derivatives thereof, polysilane compounds, vinylcarbazole compounds, thiophene compounds, aniline compounds and the like.

The examples of such hole transporting materials include α-naphthyl phenyl diamine (αNPD), porphyrin, metal tetraphenylporphyrin, metal naphthalocyanine, 4,4',4"-trimethyltriphenylamine, 4,4',4"-tris (3-methylphenylphenylamino) triphenylamine (m-MTDATA), N,N,N',N'-tetrakis (p-tolyl) p-phenylenediamine, N,N,N',N'-tetraphenyl-4,4"-diaminobiphenyl, N-phenylcarbazole, 4-di-p-tolylaminostilbene, poly (paraphenylenevinylene), poly (thiopheneviylene), poly (2,2'-thienylpyrrole), and the like, but it is not limited thereto.

As a material of the hole injection layer 166a, for example, 2,3,6,7,10,11-hexacyano-1,4,5,8,9,12-hexaazatriphenylene (HAT-CN) represented by the following chemical formula 1 can be used. The thickness of the hole injection layer 166a is preferably in the range of 1 nm to 10 nm. As a material of the hole transporting layer 166b, for example, N,N-di (naphthalene-1-yl)-N,N-diphenyl benzidine (NPB) represented by the following chemical formula 2 can be used. The thickness of the hole transporting layer 166b is preferably in the range of 10 nm to 25 nm.

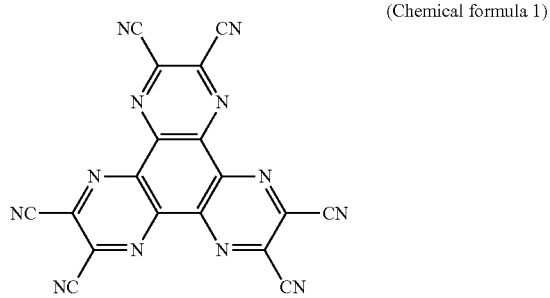

(Chemical formula 1)

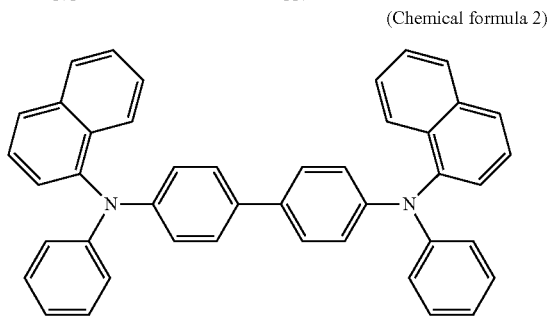

(Chemical formula 2)

HTEB 02 or HTEB 04 manufactured by Kanto Kagaku Co., Ltd., for example, can be used as the material of the electron blocking layer 166c. The thickness of the electron blocking layer 166c is preferably in the range of 5 nm to 15 nm.

The light emitting layer 166d is formed by combining a host material which is appropriately required from among the hole transporting material, electron transporting material, and dual charge transporting material described above. As the host material, for example, 4,4'-N,N'-dicarbazolebiphenyl (CBP) represented by the following chemical formula 3 and a light emitting host BH 140 manufactured by Idemitsu Kosan Co., Ltd. can be used. Further, a required dopant material can be included from the red light emitting material, the green light emitting material or the blue light emitting material according to the arrangement of the pixels. The thickness of the light emitting layer 166d is preferably in the range of 10 nm to 40 nm.

(Chemical formula 3)

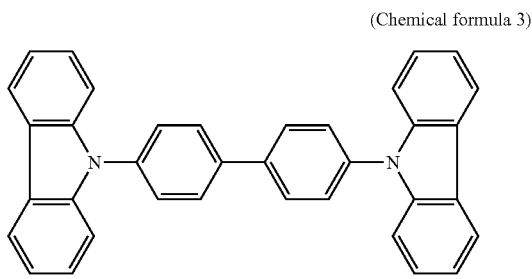 [SMILES: c1ccc2c(c1)c1ccccc1n2-c1ccc(-c2ccc(-n3c4ccccc4c4ccccc43)cc2)cc1]

As the red light emitting material, for example, a cyclopentadiene derivative, a tetraphenyl butadiene derivative, a triphenylamine derivative, an oxadiazole derivative, a bathophenanthroline derivative, a pyrazoloquinoline derivative, a styrylbenzene derivative, a styrylarylene derivative, an aminostyryl derivative, a silole derivative, thiophene ring compounds, pyridine ring compounds, perinone derivatives, perylene derivatives, oligothiophene derivatives, coumarin derivatives, rubrene derivatives, quinacridone derivatives, squarylium derivatives, porphyrin derivatives, styryl dyes, a tetracene derivative, a pyrazoline derivative, a trifuranylamine derivative, an anthracene derivative, a diphenylanthracene derivative, a pyrene derivative, a carbazole derivative, an oxadiazole dimer, a virazoline dimer, an aluminum quinolinol complex, a benzoquinolinol beryllium complex, a benzoxazole zinc complex, a benzthiazole zinc complex, azomethyl zinc complex, porphyrin zinc complex, eurobium complex, iridium complex, platinum complex, and the like such as a metal complex having a metal such as Al, Zn, Be, Pt, Ir, Tb, Eu, Dy or the like as a central metal and having oxadiazole, thiadiazole, phenylpyridine, phenylbenzimidazole, quinoline structure or the like as a ligand, are exemplified.

As the green light emitting material, one or more materials are appropriately selected from the materials mentioned above.

As an example of the blue light emitting material, perylene can be used, but it is not limited thereto. As the blue light emitting material, for example, BD 102 manufactured by Idemitsu Kosan Co., Ltd. can be used. The emission spectrum of the blue light emitting material is in the range of 440 nm to 470 nm. The extraction efficiency of the light emitted from the organic layer 166 including the blue light emitting material can be further improved.

As a material of the hole blocking layer 166e, for example, 4,4'-N,N'-dicarbazole-biphenyl (CBP) represented by the following chemical formula 3 and 2,9-dimethyl-4,7-diphenyl-1,10-phenanthroline (BCP) can be used. The thickness of the hole blocking layer 166e is preferably in the range of 5 nm to 15 nm.

(Chemical formula 3)

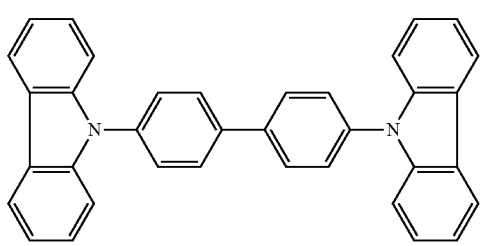

Examples of the electron transporting material used for the electron transporting layer 166f and the electron injection layer include 8-hydroxyquinoline aluminum ($Alq_3$), 8-hydroxymethylquinoline aluminum, anthracene, naphthalene, phenanthrene, pyrene, chrysene, perylene, Butadiene, coumarin, acridine, stilbene, derivatives thereof, and the like, but are not limited thereto.

In the present embodiment, the electron transporting layer 166f contains an alkali metal or an alkaline earth metal such as lithium (Li) or calcium (Ca) in a range of 1 vol % to 90 vol %, per 100 vol % of the electron transporting material. The electron transporting layer 166f preferably contains an alkali metal or an alkaline earth metal such as lithium (Li) or calcium (Ca) in a range of 1 vol % to 20 vol %, per 100 vol % of the electron transporting material, more preferably in the range of 1 vol % to 10 vol %. Alkali metal or alkaline earth metal such as lithium (Li) or calcium (Ca) contained in the electron transporting material may be uniformly included in the electron transporting layer 166f, or may be included in at least a part thereof. By adopting such a composition and structure, the electron mobility of the electron transporting layer 166f in the present embodiment can be improved. By increasing the electron mobility of the electron transporting layer 166f, even if the optical path length from the light emitting layer 166d to the semi-reflecting surface is increased with respect to the optical path length from the light emitting layer 166d to the total reflection surface, the increase in the driving voltage can be suppressed.

As the material of the electron transporting layer 166f, for example, 2,4-bis(4-biphenyl)-6-(4'-(2-pyridyl)-4-diphenyl)-[1,3,5]triazine (MPT) containing 5 volume % of lithium can be used. The thickness of the electron transporting layer 166f is preferably in the range of 115 nm to 160 nm. By adopting such a composition and structure, the organic EL display device 100 including a light emitting device with improved light extraction efficiency can be provided.

(Chemical formula 4)

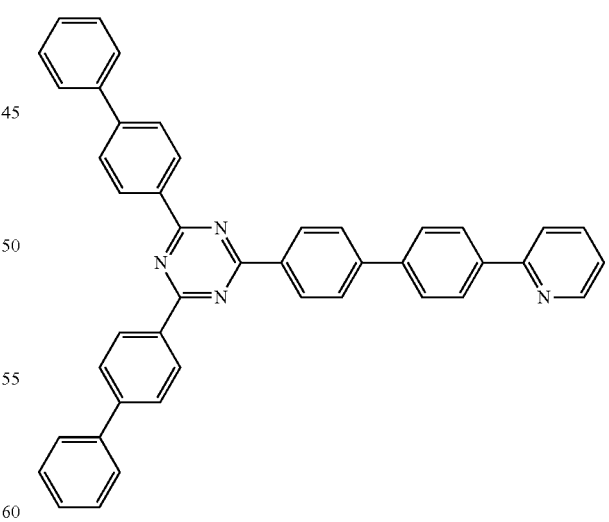

As shown in FIG. 4, when a voltage is applied between the pixel electrode 164 and the opposite electrode 168 of the light emitting device 140, electrons are injected from the opposite electrode 168, and holes are injected from the pixel electrode 164. The electrons injected from the opposite electrode 168 move toward the electron transporting layer 166f, the hole blocking layer 166e, and the light emitting layer 166d. The holes injected from the pixel electrode 164 move toward the hole injection layer 166a, the hole transporting layer 166b, the electron block layer 166c, and the light emitting layer 166d. The electron transporting layer 166f contains an alkali metal or an alkaline earth metal such as lithium or calcium so that electron mobility of the electron transporting layer 166f can be improved. Thus, the film thickness A of the electron transporting layer 166f and the hole blocking layer 166e can be made larger than the film thickness B of the hole injection layer 166a, the hole transporting layer 166b, and the electron blocking layer 166c. The total film thickness of the electron transporting layer 166f and the hole blocking layer 166e is preferably in the range of 130 nm to 170 nm. The total film thickness of the hole injection layer 166a, the hole transporting layer 166b, and the electron block layer 166c is preferably in the range of 20 nm to 50 nm. By adopting such a structure, a carrier balance of the organic layer 166 can be obtained, and the light emitting efficiency of the light emitting device 140 can be improved.

The electrons and the holes recombine with the host molecule in the light emitting layer 166d. As a result, the luminescent molecules in the light emitting layer 166d are excited by the energy released thereby and then de-excited to emit light. The light emitted from the light emitting layer 166d repeatedly reflects between the total reflection surface (indicated by a dotted line in FIG. 4) disposed on the opposite side of the organic layer 166 of the pixel electrode 164 and the semi-reflecting surface disposed on the side of organic layer 166 of the opposite electrode 168. In the present embodiment, the optical path length from the light emitting layer 166d to the semi-reflecting surface is longer than the optical path length from the light emitting layer 166d to the total reflection surface, so that the light emitted from the organic layer 166 can be efficiently extracted by the optical interference. Therefore, the film thickness A of the electron transporting layer 166f and the hole blocking layer 166e is set to be larger than the film thickness C of the pixel electrode 164a (the film thickness of the transparent conductive material from the total reflection surface to the surface of the organic layer 166 side), the hole injection layer 166a, the hole transporting layer 166b, and electron blocking layer 166c. The total film thickness of the electron transporting layer 166f and the hole blocking layer 166e is preferably in the range of 130 nm to 170 nm. The total film thickness of the pixel electrode 164a, the hole injection layer 166a, the hole transporting layer 166b, and the electron block layer 166c is preferably in the range of 30 nm to 60 nm. By adopting such a structure, the light extraction efficiency of the light emitting device 140 can be improved.

The configuration of the light emitting device 140 and the organic EL display device 100 according to the present embodiment has been described above. In the light emitting device 140 according to present embodiment, the electron mobility of the electron transporting layer 166f can be improved by including an alkali metal or an alkaline earth metal such as lithium or calcium in the electron transporting layer 166f of the organic layer 166. Thereby, even if the optical path length from the light emitting layer 166d to the semi-reflecting surface is increased with respect to the optical path length from the light emitting layer 166d to the total reflection surface, the increase in driving voltage can be suppressed. By adopting such a composition and structure, the organic EL display device 100 including a light emitting device 140 with improved light extraction efficiency can be provided.

Example

Figure 5C:
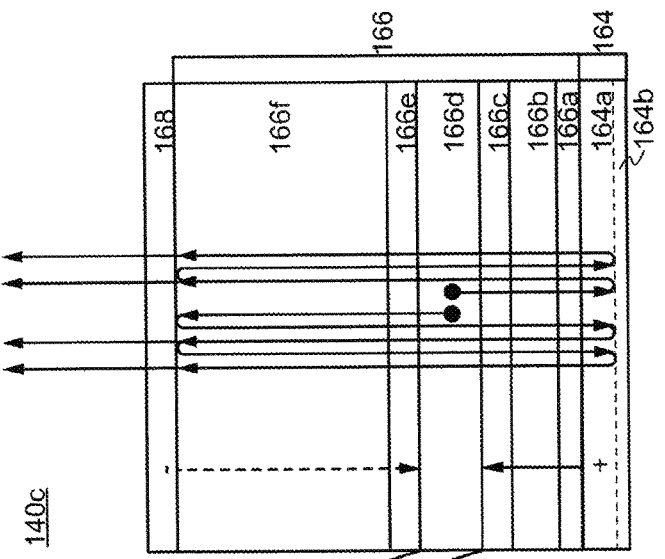
Figure 5B:
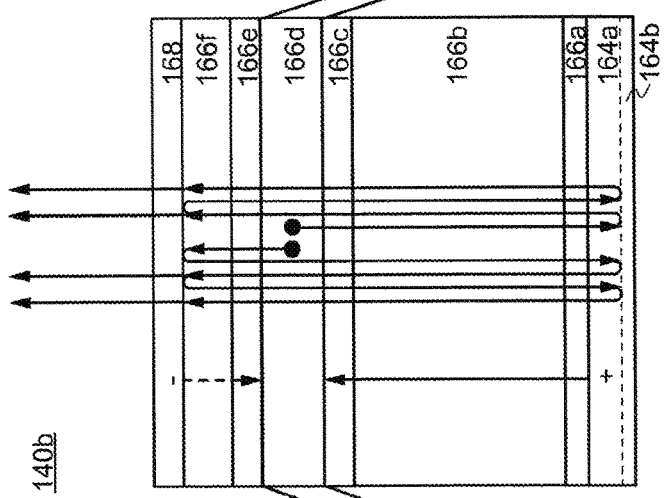
Figure 5A:
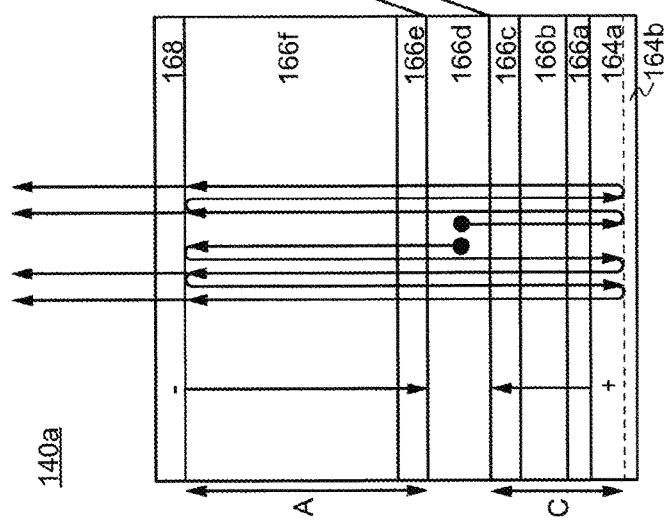

Next, the configuration of the light emitting device 140 according to the example and the comparative example will be described with reference to FIG. 5A to FIG. 5C. FIG. 5A to FIG. 5C are enlarged cross-sectional views showing the configuration of the organic EL display device according to the example and the comparative example.

Example 1

FIG. 5A is an enlarged sectional view of a light emitting device 140a according to Example 1. The material and the film thickness of the organic layer 166 of the light emitting device 140a according to Example 1 are as follows;
Pixel electrode 164a: ITO, 10 nm
Hole injection layer 166a: HAT-ON, 5 nm
Hole transporting layer 166b: NPB, 15 nm
Electron blocking layer 166c: HTEB 04, 10 nm
Light emitting layer 166d: host material CBP, dopant material BD 102, 15 nm
Hole blocking layer 166e: CBP, 10 nm
Electron transporting layer 166f: MPT+10% Li, 125 nm
Opposite electrode 168: Mg—Ag alloy, 10 nm Comparative Example 1

FIG. 5B is an enlarged sectional view of a light emitting device 140b according to Comparative Example 1. The material and the film thickness of the organic layer 166 of the light emitting device 140b according to Comparative Example 1 are as follows;
Pixel electrode 164a: ITO, 10 nm
Hole injection layer 166a: HAT-ON, 5 nm
Hole transporting layer 166b: NPB, 125 nm
Electron blocking layer 166c: HTEB 04, 10 nm
Light emitting layer 166d: host material CBP, dopant material BD 102, 15 nm
Hole blocking layer 166e: CBP, 10 nm
Electron transporting layer 166f: MPT, 15 nm
Opposite electrode 168: Mg—Ag alloy, 10 nm Comparative Example 2

FIG. 5O is an enlarged sectional view of a light emitting device 140c according to Comparative Example 2. The material and the film thickness of the organic layer 166 of the light emitting device 140c according to Comparative Example 2 are as follows;
Pixel electrode 164a: ITO, 10 nm
Hole injection layer 166a: HAT-ON, 5 nm
Hole transporting layer 166b: NPB, 15 nm
Electron blocking layer 166c: HTEB 04, 10 nm
Light emitting layer 166d: host material CBP, dopant material BD 102, 15 nm
Hole blocking layer 166e: CBP, 10 nm
Electron transporting layer 166f: MPT, 125 nm
Opposite electrode 168: Mg—Ag alloy, 10 nm Using the organic EL display device 100 containing the light emitting devices 140a, 140b, and 140c according to the example and the comparative example, the following measurements were performed in order to evaluate the characteristics.

<Electrical Characteristics>

A driving voltage and current efficiency at a current density of 15 mA cm$^2$ were obtained.

<Chromaticity, Emission Spectrum>

The emission spectrum was measured with a spectrometer and the peak wavelength was determined. The chromaticity of the luminescent color was measured with a spectral luminance meter CS2000 manufactured by Konica Minolta.

<Life Measurement>

Changes in brightness of the device were measured under continuous driving at a constant current (current density 50 mA/cm$^2$), and the time at which the brightness decreased by 5% from the initial brightness (LT 95) was calculated.

The results are shown in Table 1.

TABLE 1

|  | Film thickness A | Film thickness C | Li | Peak wavelength | Driving voltage | Current efficiency | CIEx | CIEy | LT95 |
|---|---|---|---|---|---|---|---|---|---|
| Example 1 | 135 nm | 40 nm | + | 450 nm | 3.2 V | 7.3 cd/A | 0.140 | 0.045 | 1200 Hr |
| Comparative example 1 | 25 nm | 150 nm | − | 450 nm | 3.4 V | 6.9 cd/A | 0.144 | 0.045 | 500 Hr |
| Comparative example 2 | 135 nm | 40 nm | − | 450 nm | 17.0 V | 0.1 cd/A | 0.148 | 0.076 | — |

As shown in Table 1, by including lithium in the electron transporting layer 166f, even if the light emitting device 140a according to Example 1 has the film thickness A from the light emitting layer 166d to the semi-reflecting surface longer than the film thickness C from the light emitting layer 166d to the total reflection surface, the current efficiency was high and the increase in the driving voltage could be suppressed. Since the electron mobility is low in the light emitting device 140b according to Comparative Example 1 which is a conventional structure not containing lithium in the electron transporting layer 166f, when the film thickness A is increased with respect to the film thickness C in the light emitting device 140c according to Comparative Example 2, the current efficiency remarkably decreased and the driving voltage increased. Compared with Comparative Example 1 and Comparative Example 2, the color purity and LT 95 of Example 1 were significantly improved.

What is claimed is:

1. A light emitting device comprising:

a first electrode arranged on a substrate and having a reflective surface disposed on the substrate side;

an organic layer disposed on the opposite side to the substrate with the first electrode interposed therebetween; and a second electrode having a semi-transparent property disposed on the opposite side to the first electrode with the organic layer interposed therebetween, wherein the organic layer comprises a first organic layer having a hole injecting property arranged on the first electrode;

a second organic layer having a hole transporting property arranged on the first organic layer;

a third organic layer having an electron blocking property arranged on the second organic layer;

a light emitting layer containing a host material and a dopant material arranged on the third organic layer;

a fourth organic layer having a hole blocking property arranged on the light emitting layer; and a fifth organic layer having an electron transporting property arranged on the fourth organic layer, wherein the fifth organic layer includes an alkali metal or an alkaline earth metal, and a total layer thickness of the first organic layer, the second organic layer, and the third organic layer is smaller than a total layer thickness of the fourth organic layer and the fifth organic layer.

2. The light emitting device according to claim 1, wherein the total layer thickness from the reflective surface to the third organic layer is smaller than the total layer thickness of the fourth organic layer and the fifth organic layer.

3. The light ting device according to claim 1, wherein the second electrode includes a layer of silver or an alloy containing silver.

4. The light emitting device according to claim 1, wherein the second electrode has a transmittance in the range of 20% to 90%.

5. The light ting device according to claim 1, wherein the total layer thickness of the first organic layer, the second organic layer, and the third organic layer is in the range of 20 nm to 50 nm.

6. The light emitting device according to claim 1, wherein the total layer thickness of the fourth organic layer and the fifth organic layer is in the range of 130 nm to 170 nm.

7. The light emitting device according to claim 1, wherein the total layer thickness from the reflective surface to the third organic layer is in the range of 30 nm to 60 nm.

8. The light ting device according to claim 1, wherein a layer thickness of the light emitting layer is in the range of 10 nm to 40 nm.

9. The light emitting device according to claim 1, wherein a peak wavelength of an emission spectrum of the light emitting layer is in the range of 440 nm to 470 nm.

10. The light emitting device according to claim 1, wherein the fifth organic layer includes the alkali metal or the alkaline earth metal in the range of 1 vol % to 90 vol %, and the alkali metal or the alkaline earth metal include calcium or lithium.

11. A display device having a pixel including a light emitting device, the light emitting device comprising:

a first electrode arranged on a substrate and having a reflective surface disposed on the substrate side;

an organic layer disposed on the opposite side to the substrate with the first electrode interposed therebetween; and a second electrode having a semi-transparent property disposed on the opposite side to the first electrode with the organic layer interposed therebetween, wherein the organic layer comprises a first organic layer having a hole injecting property arranged on the first electrode;

a second organic layer having a hole transporting property arranged on the first organic layer;

a third organic layer having an electron blocking property arranged on the second organic layer;

a light emitting layer containing a host material and a dopant material arranged on the third organic layer;

a fourth organic layer having a hole blocking property arranged on the light emitting layer; and a fifth organic layer having an electron transporting property arranged on the fourth organic layer, wherein the fifth organic layer includes an alkali metal or an alkaline earth metal, and a total layer thickness of the first organic layer, the second organic layer, and the third organic layer is smaller than a total layer thickness of the fourth organic layer and the fifth organic layer.

12. The display device according to claim 11, wherein the total layer thickness from the reflective surface to the third organic layer is smaller than the total layer thickness of the fourth organic layer and the fifth organic layer.

13. The display device according to claim 11, wherein the second electrode includes a layer of silver or an alloy containing silver.

14. The display device according to claim 11, wherein the second electrode has a transmittance in the range of 20% to 90%.

15. The display device according to claim 11, wherein the total layer thickness of the first organic layer, the second organic layer, and the third organic layer is in the range of 20 nm to 50 nm.

16. The display device according to claim 11, wherein the total layer thickness of the fourth organic layer and the fifth organic layer is in the range of 130 nm or more and 170 nm or less.

17. The display device according to claim 11, wherein the total layer thickness from the reflective surface to the third organic layer is in the range of 30 nm or more and 60 nm or less.

18. The display device according to claim 11, wherein a layer thickness of the light emitting layer is in the range of 10 nm or more and 40 nm or less.

19. The display device according to claim 11, wherein a peak wavelength of an emission spectrum of the light emitting layer is in the range of 440 nm or more and 470 nm or less.

20. The display device according to claim 11, wherein the fifth organic layer includes the alkali metal or the alkaline earth metal in the range of 1 vol % to 90 vol %, and the alkali metal or the alkaline earth metal include calcium or lithium.

* * * * *